United States Patent
Williams et al.

[11] Patent Number: 6,107,849
[45] Date of Patent: Aug. 22, 2000

[54] AUTOMATICALLY COMPENSATED CHARGE PUMP

[75] Inventors: Stephen T. Williams, Laurel; Eric Naviasky, Ellicot City; Michael Hufford, Catonsville, all of Md.

[73] Assignee: Cadence Design Systems, Inc., San Jose, Calif.

[21] Appl. No.: 09/140,103

[22] Filed: Aug. 25, 1998

[51] Int. Cl.[7] .................................................. H03L 7/093
[52] U.S. Cl. .......................................... 327/157; 327/148
[58] Field of Search .................................... 327/148, 159, 327/536, 537, 157; 331/15, 16, 17

[56] References Cited

U.S. PATENT DOCUMENTS

| | | | |
|---|---|---|---|
| 5,334,953 | 8/1994 | Mijuskovic | 331/15 |
| 5,457,326 | 10/1995 | Masuda | 327/157 |
| 5,592,120 | 1/1997 | Palmer et al. | 327/536 |
| 5,977,806 | 11/1999 | Kikuchi | 327/157 |

*Primary Examiner*—Tuan T. Lam
*Attorney, Agent, or Firm*—Hickman Palermo; Truong & Becker, LLP; Bobby K. Truong

[57] ABSTRACT

A charge pump having an automatic compensation capability comprises a current source and a current sink. The current source is selectively coupled to the output of the charge pump by a sourcing control. The sourcing control receives an input control signal and responds by controlling the sourcing current flowed from the current source to the output. Likewise, the current sink is selectively coupled to the output of the charge pump by a sinking control. The sinking control receives a second input control signal and responds by controlling the sinking current flowed from the output to the current sink. The charge pump further comprises a sensing circuit and a compensating circuit. The sensing circuit determines whether, given substantially identical input control signals, there is a difference between the sourcing current and the sinking current generated by the charge pump. If so, the sensing circuit provides at its output an indication of the current difference. In turn, the compensating circuit receives as input the indication of the current difference, and adjusts the sinking current in accordance with the indication of the current difference such that the sinking current equalizes the sourcing current. In an alternative embodiment, the compensating circuit adjusts the sourcing current rather than the sinking current to equalize the sourcing current with the sinking current. In either embodiment, a substantially zero net current is produced at the output of the charge pump when the input control signals are substantially identical.

24 Claims, 3 Drawing Sheets

AUTOMATICALLY COMPENSATED CHARGE PUMP

FIELD OF THE INVENTION

This invention relates generally to electronic circuits and more particularly to an automatically compensated charge pump.

BACKGROUND OF THE INVENTION

In electronic device implementations, it is often necessary to transfer information synchronously between different components. Such a situation may arise, for example, when transferring data between several chips or between several blocks on a chip. Because each component typically runs off of its own internal clock signal, synchronous information transfer is usually achieved by providing a reference clock signal to each of the components and then having each of the components synchronize its internal clock signal with the reference clock signal. Once synchronization is achieved, the components perform the information transfer using their own internal clock signals.

To synchronize a component's internal clock signal with a reference clock signal, a phase lock loop (PLL) is often used. A typical PLL is shown in FIG. 1, wherein the PLL 110 comprises a phase frequency detector (PFD) 112, a charge pump 114, a loop filter 116, and a voltage controlled oscillator (VCO) 118. The internally generated clock signal DCLK and the reference clock signal RCLK are fed as inputs to the PFD 112. The function of the PFD 112 is to detect the difference in phase and frequency between the two clock signals, and to generate output control signals UP and DOWN indicative of the phase and frequency differences. These control signals UP, DOWN are then fed as inputs to the charge pump 114. In response, the charge pump 114 generates a net current in accordance with the input control signals UP, DOWN, to either charge or discharge the loop filter 116 to a particular voltage. It is the voltage on loop filter 116 that controls the frequency of the DCLK generated by VCO 118. Preferably, the voltage present at the input of the VCO 118 is such that it causes the VCO 118 to generate a new DCLK signal having a frequency and phase closer to that of the reference signal RCLK. In this manner, the PLL 110 "pushes" DCLK towards RCLK.

Once the new DCLK is generated, it is fed back to the input of the PFD 112 along with RCLK and the process is repeated. Because of the feedback loop, this adjustment process continues until DCLK "locks on" to RCLK in both phase and frequency. In some implementations, it is desirable for DCLK to have a frequency that is a multiple of the RCLK frequency. In such implementations, a modulo n feedback counter 120 is inserted into the feedback path as shown. If a counter 120 is used, a corresponding delay element 122 having the same delay as the counter is usually imposed between RCLK and the input of the PFD 112 to equalize signal delays.

Once DCLK locks on to RCLK, the two signals will be completely in phase. As a result, the outputs UP, DOWN of PFD 112 will indicate that there is no phase difference. This condition typically is manifested by the UP and DOWN control signals having the same pulse width. In response to the input control signals having the same pulse width, the charge pump 114 ideally outputs a net current of zero so that no further charge is injected into the loop filter 116, thereby maintaining the overall loop in locked condition. In order to achieve this, however, the charge pump 114 is required to source and sink the same amount of current. Because a charge pump typically contains both PMOS and NMOS devices, and because these types of devices have mobility and capacitance differences, sourcing and sinking the same amount of current given equal control pulse widths is very difficult to do. If the charge pump 114 is unable to generate zero net current for control signals having equal pulse widths, the PLL 110 will be forced to maintain unequal pulse widths in the UP and DOWN control signals to obtain zero net current from the charge pump. To have unequal pulse widths in the UP and DOWN control signals, a phase difference needs to exist between the DCLK and the RCLK signals. This phase difference in turn causes clock skew to be imposed on the inputs of the PFD 112, a very undesirable result. To overcome this problem, what is needed is a charge pump that is capable of generating substantially zero net current given input control signals having substantially identical pulse widths.

SUMMARY OF THE INVENTION

The present invention provides a charge pump having an automatic compensation capability. More particularly, the charge pump of the present invention senses whether, given substantially identical input control signals, there is a difference between the current being sourced and the current being sunk by the charge pump. If there is a difference, then the charge pump automatically adjusts either the sourcing current or the sinking current to equalize the two currents. By so doing, the charge pump of the present invention ensures that when substantially identical input control signals are applied, a substantially zero net current results.

In a first preferred embodiment, the charge pump of the present invention comprises a current source and a current sink. The current source is selectively coupled to the output of the charge pump by a sourcing control. The sourcing control receives an input control signal, such as an UP signal from a PFD, and responds by controlling the sourcing current flowed from the current source to the output. Likewise, the current sink is selectively coupled to the output of the charge pump by a sinking control. The sinking control receives a second input control signal, such as a DOWN signal from a PFD, and responds by controlling the sinking current flowed from the output to the current sink. The charge pump preferably further comprises a sensing circuit and a compensating circuit. The sensing circuit determines whether, given substantially identical input control signals, there is a difference between the sourcing current and the sinking current generated by the charge pump. If so, the sensing circuit provides at its output an indication of the current difference. In turn, the compensating circuit receives as input the indication of the current difference, and adjusts the sinking current in accordance with the indication of the current difference such that the sinking current equalizes the sourcing current. This causes a substantially zero net current to be produced at the output of the charge pump when the input control signals are substantially identical.

In an alternative preferred embodiment, the compensating circuit adjusts the sourcing current rather than the sinking current. More particularly, in response to the indication of the current difference from the sensing circuit, the compensating circuit adjusts the sourcing current until the sourcing current equalizes the sinking current. In either embodiment, a substantially zero net current is produced at the output of the charge pump when the input control signals are substantially identical.

DETAILED DESCRIPTION OF THE PREFERRED EMBODIMENTS

FIRST PREFERRED EMBODIMENT

Figure 2:
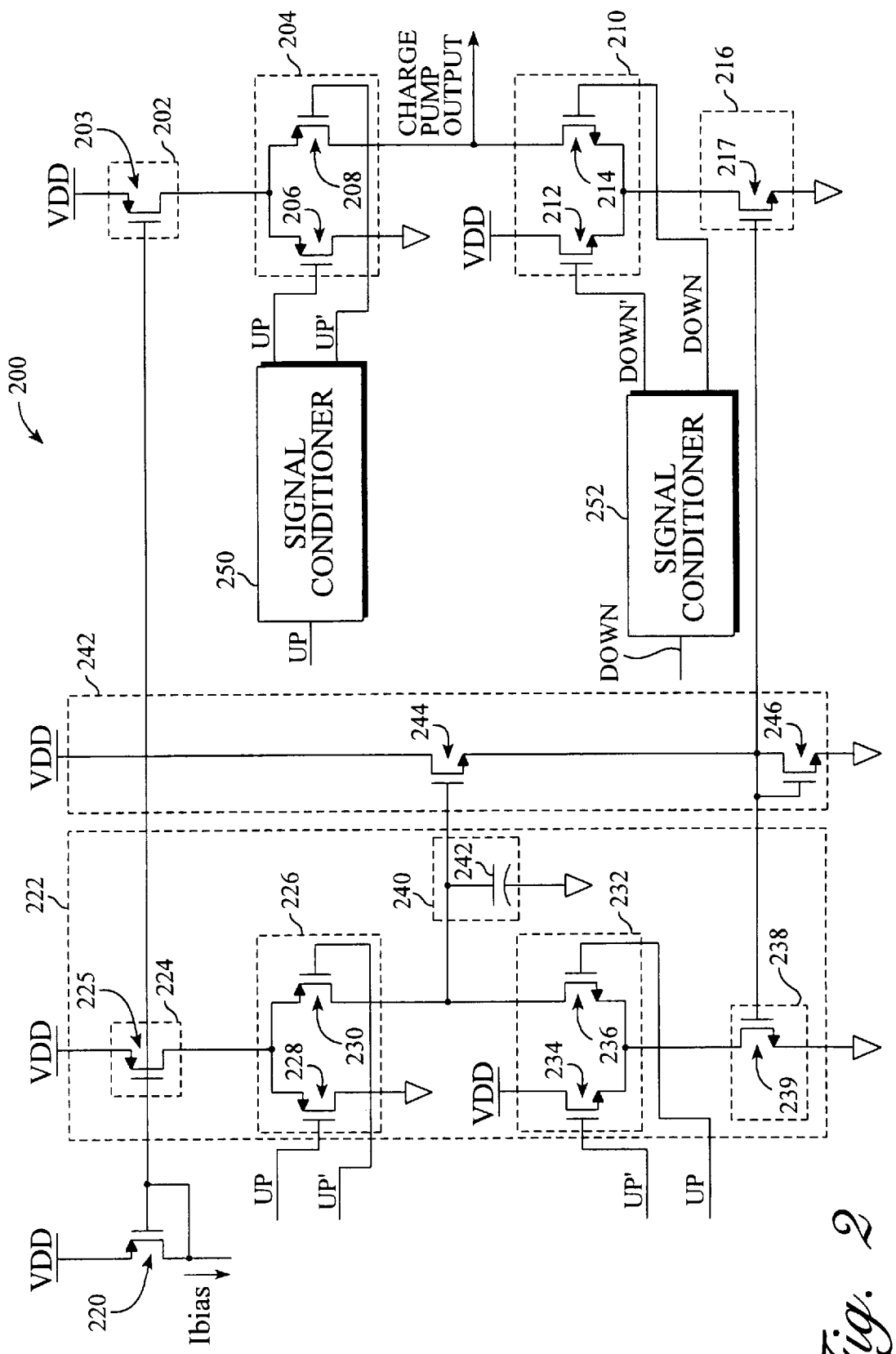
FIG. 2 is a circuit diagram of a first preferred embodiment of the present invention.

With reference to FIG. 2, there is shown a circuit diagram of a first preferred embodiment of the present invention. In this preferred embodiment, PMOS and NMOS transistors are used to implement the invention. However, it should be noted that other types of transistors, including but not limited to other types of MOSFET's, JFET's and BJT's, may also be used. In addition, devices other than transistors which perform the same or similar functions may be substituted. To facilitate description of the invention, the following notation will be employed. A PMOS transistor will be shown as a transistor having a solid arrow pointing towards the gate of the transistor, while an NMOS transistor will be shown as having a solid arrow pointing away from the gate. Also, the terminal of the transistor having the solid arrow will be the source terminal, regardless of the direction in which the arrow points. Thus, according to this convention, transistor 203 is a PMOS transistor having its source terminal coupled to a voltage source VDD, and transistor 217 is an NMOS transistor having its source terminal coupled to ground.

Charge pump 200 preferably first comprises a current source 202, a current sink 216, a sourcing control 204, a sinking control 210, and a biasing transistor 220. The current source 202 is the element in the charge pump 200 that supplies the sourcing current to the output of the charge pump. In the preferred embodiment, current source 202 takes the form of a PMOS transistor 203 having a source terminal coupled to a voltage source VDD, a drain terminal coupled to sourcing control 204, and a gate terminal coupled to the gate terminal of biasing transistor 220. Because the gate terminals of transistors 203 and 220 are coupled together, they are said to be "mirrored", which means that the same current flows through both of them.

Figure 1:
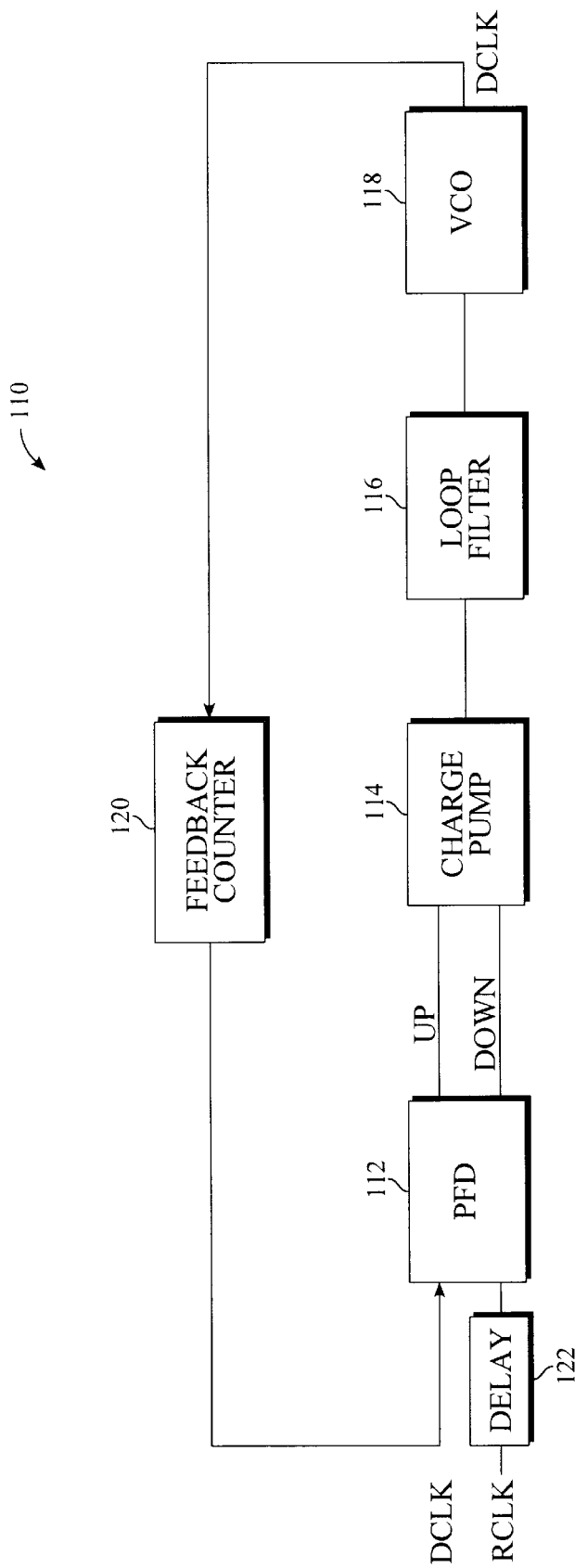
FIG. 1 is a block diagram representation of a typical phase lock loop.

The amount of sourcing current that is flowed from the current source 202 to the output of the charge pump is determined by the sourcing control 204. Sourcing control 204 preferably controls the sourcing current flow in response to two input control signals UP and UP'. These signals UP, UP' represent, respectively, the actual and the inverse of the UP signal outputted by the PFD 112 (FIG. 1). In the preferred embodiment, sourcing control 204 takes the form of a dual transistor switch comprising a first PMOS transistor 206 having a source terminal coupled to the current source 202, a drain terminal coupled to ground, and a gate terminal coupled to receive the UP control signal, and a second PMOS transistor 208 having a source terminal coupled to the current source 202, a drain terminal coupled to the output of the charge pump 200, and a gate terminal coupled to receive the UP' control signal. Because the control signals UP, UP' are coupled to the gates of transistors 206 and 208, they control the conductivity of the transistors. Because transistors 206 and 208 are coupled to ground and to the output of the charge pump, respectively, they can direct the sourcing current from the current source 202 to either destination, depending upon the state of the control signals UP, UP'. By selectively directing the current flow in response to the control signals UP, UP', the sourcing control 204 determines the amount of sourcing current that is flowed from the current source 202 to the output of the charge pump.

In the preferred embodiment, the input control signals UP and UP' are generated by a signal conditioner 250. Conditioner 250 performs two primary functions. First, it transforms the UP signal from the PFD 112 (FIG. 1) into two separate signals, with one signal (UP) representing the UP signal and the other signal (UP') representing the inverse of the UP signal. Second and more importantly, conditioner 250 reduces the voltage swing of the original UP signal. To elaborate, if a control signal having a large voltage swing is applied to the gates of transistors 206 and 208, it can cause the transistors to saturate. This is an undesirable result because a saturated transistor requires more time to perform a switching operation than an unsaturated transistor. To prevent this problem from arising, conditioner 250 preferably generates the control signals UP, UP' such that they have sufficiently low voltage swing to ensure that saturation will not occur.

The current sink 216 is the element in the charge pump 200 that sinks current from the output of the charge pump. In the preferred embodiment, current sink 216 takes the form of an NMOS transistor 217 having a source terminal coupled to ground, a drain terminal coupled to sinking control 210, and a gate terminal coupled to the gate terminals of transistors 239 and 246. Because the gate terminals of transistors 217, 239, and 246 are coupled together, they are said to be "mirrored", which means that the same current flows through all of them. More will be said about this in a later section.

The amount of sinking current that is flowed from the output of the charge pump to the current sink 216 is determined by the sinking control 210. Sinking control 210 preferably controls the sinking current flow in response to two input control signals DOWN and DOWN'. These signals DOWN, DOWN' represent, respectively, the actual and the inverse of the DOWN signal outputted by the PFD 112. In the preferred embodiment, sinking control 210 takes the form of a dual transistor switch comprising a first NMOS transistor 212 having a drain terminal coupled to a voltage source VDD, a source terminal coupled to the current sink 216, and a gate terminal coupled to receive the DOWN' control signal, and a second NMOS transistor 214 having a drain terminal coupled to the output of the charge pump, a source terminal coupled to the current sink 216, and a gate terminal coupled to receive the DOWN control signal. Because the control signals DOWN', DOWN are coupled to the gates of transistors 212 and 214, they control the conductivity of the transistors. Because transistors 212 and 214 are coupled to voltage source VDD and to the output of the charge pump, respectively, they can direct current to the current sink 216 from either source, depending upon the state of the control signals DOWN, DOWN'. By selectively directing the current flow in response to the control signals DOWN, DOWN', the sinking control 210 determines the amount of sinking current that is flowed from the output of the charge pump to the current sink 216.

In the preferred embodiment, the input control signals DOWN, DOWN' are generated by a second signal conditioner 252. Conditioner 252 is like conditioner 250 in most respects. First, conditioner 252 transforms a control signal (the DOWN signal) from the PFD 112 into two separate signals, with one signal (DOWN) representing the DOWN signal and the other signal (DOWN') representing the inverse of the DOWN signal. In addition, conditioner 252 reduces the voltage swing of the DOWN signal and provides control signals DOWN and DOWN' that have sufficiently low voltage swing to ensure that transistors 212 and 214 will not saturate.

When the charge pump 200, as thus far described, is in operation, current is both sourced to and sunk from the output of the charge pump. Ideally, when the UP and DOWN signals from the PFD 112 are substantially identical, the amount of current being sourced should be the same as the amount of current being sunk such that a zero net current is produced at the output of the charge pump. However, note that PMOS devices are used for the current source 202 and the sourcing control 204 while NMOS devices are used for the current sink 216 and the sinking control 210. Because of mobility and capacitance differences between PMOS and NMOS devices, the sourcing current is usually not the same as the sinking current given substantially identical UP and DOWN control signals. To correct this discrepancy, sensing circuit 222 and compensating circuit 242 may be used.

SENSING CIRCUIT

In the preferred embodiment, sensing circuit 222 is substantially similar to the portion of the charge pump 200 that has been described thus far. More particularly, sensing circuit preferably comprises a current source 224, a current sink 238, a sourcing control 226, and a sinking control 232. Sensing circuit 222 preferably further comprises a charge collection element 240 which serves as the output of the sensing circuit 222.

The current source 224 provides the sourcing current for the sensing circuit 222. In the preferred embodiment, current source 224 takes the form of a PMOS transistor 225 having a source terminal coupled to a voltage source VDD, a drain terminal coupled to the sourcing control 226, and a gate terminal coupled to the gate terminals of both the biasing transistor 220 and the sourcing transistor 203. Because the gate terminals of transistors 225, 220, and 203 are coupled together, they are "mirrored" and thus, will carry the same amount of current. The significance of this will be made clear in a later section.

The amount of sourcing current that is flowed from the current source 224 to the charge collection element 240, which serves as the output of the sensing circuit 222, is determined by the sourcing control 226. Sourcing control 226 preferably controls the sourcing current flow in response to two input control signals UP and UP'. These signals may be received from signal conditioner 250, which was previously described. In the preferred embodiment, sourcing control 226 takes the form of a dual transistor switch comprising a first PMOS transistor 228 having a source terminal coupled to the current source 224, a drain terminal coupled to ground, and a gate terminal coupled to receive the UP control signal, and a second PMOS transistor 230 having a source terminal coupled to the current source 224, a drain terminal coupled to the charge collection element 240, and a gate terminal coupled to receive the UP' control signal. Preferably, sourcing control 226 is constructed such that it is substantially identical to sourcing control 204. By selectively directing current flow in response to the control signals UP, UP', sourcing control 226 determines the amount of sourcing current that is flowed from the current source 224 to the charge collection element 240 of the sensing circuit 222.

The current sink 238 is the element in the sensing circuit 222 that sinks current from the charge collection element 240. In the preferred embodiment, current sink 238 takes the form of an NMOS transistor 239 having a source terminal coupled to ground, a drain terminal coupled to sinking control 232, and a gate terminal coupled to the gate terminals of transistors 217 and 246. As noted previously, because the gate terminals of transistors 217, 239, and 246 are coupled together, they are "mirrored" and thus will all carry the same current. The significance of this will become clear in a later section.

The amount of sinking current that is flowed from the charge collection element 240 to the current sink 238 is determined by the sinking control 232. Sinking control 232 preferably controls the sinking current flow in response to two input control signals UP and UP'. Notice that these are the same control signals as those applied to sourcing control 226. Unlike sinking control 210, sinking control 232 does not receive the DOWN and DOWN' signals. The UP and UP' signals applied to the sinking control 232 may be received from signal conditioner 250, which was previously described. In the preferred embodiment, sinking control 232 takes the form of a dual transistor switch comprising a first NMOS transistor 234 having a drain terminal coupled to a voltage source VDD, a source terminal coupled to the current sink 238, and a gate terminal coupled to receive the UP' control signal, and a second NMOS transistor 236 having a drain terminal coupled to the charge collection element 240, a source terminal coupled to the current sink 238, and a gate terminal coupled to receive the UP control signal. Preferably, sinking control 232 is constructed such that it is substantially identical to sinking control 210. By selectively directing the current flow in response to the control signals UP, UP', the sinking control 232 determines the amount of sinking current that is flowed from the charge collection element 240 to the current sink 238.

Finally, sensing circuit 222 comprises a charge collection element 240, which serves as the output of the circuit. In the preferred embodiment, charge collection element 240 takes the form of a capacitor 242 having a first terminal coupled to the drain terminals of transistors 230 and 236, and a second terminal coupled to ground.

In the present invention, one of the primary functions of the sensing circuit 222 is to provide an indication of how the elements 202, 204, 210, and 216 of the charge pump 200 will behave when substantially identical control signals are applied. More particularly, it is the purpose of the sensing circuit 222 to provide an indication of the difference in the sourcing and sinking currents produced by current source 202 and current sink 216 when substantially identical control signals are applied to the sourcing control 204 and the sinking control 210. Because this is the purpose of sensing circuit 222, the circuit 222 has certain notable characteristics. First, it receives the same control signals UP, UP' at both the sourcing control 226 inputs and the sinking control 232 inputs. This is to ensure that substantially identical control signals are applied to both controls. In the preferred embodiment, the UP and UP' signals are used. However, it should be noted that the DOWN and DOWN' signals may be used instead. In fact, any signals may be used so long as the same signals are applied to both the sourcing control 226 and the sinking control 232. Second, the current source 224, the sourcing control 226, the sinking control 232, and the current sink 238 are preferably constructed such that they are substantially identical to the current source 202, the sourcing control 204, the sinking control 210, and the current sink 216, respectively. This serves to ensure that under similar conditions, the components will perform similarly. With these criteria satisfied, the sensing circuit 222 will provide at its output a true indication of the difference in sourcing and sinking current produced by elements 202, 204, 210, and 216 when substantially identical controls signals are applied.

COMPENSATING CIRCUIT

Once the sensing circuit 222 provides an indication of the difference in sourcing and sinking currents when substantially identical control signals are applied, it is up to the compensating circuit 242 to adjust either the sourcing current or the sinking current to equalize the two such that a substantially zero net current results at the output of the charge pump 200. In this first preferred embodiment, the compensating circuit 242 adjusts the sinking current to equalize it with the sourcing current. Compensating circuit 242 preferably comprises a first NMOS transistor 244 and a second NMOS transistor 246. Transistor 244 has a drain terminal coupled to a voltage source VDD, a gate terminal coupled to the charge collection element 240 of the sensing circuit 222, and a source terminal coupled to the drain terminal of transistor 246. In turn, transistor 246 has a drain terminal coupled to the source terminal of transistor 244, a source terminal coupled to ground, and a gate terminal coupled to the gate terminals of transistors 239 and 217, which in turn is coupled back to the source terminal of transistor 246. Because the gates of transistors 246, 239, and 217 are coupled together and are thus mirrored, they will all carry the same current. This will play an important role in enabling the functionality of the compensating circuit 242. Preferably, transistor 244 is set up as a voltage follower such that the voltage at the source of the transistor 244 will be at a relatively fixed amount below the voltage at the gate. With this setup, the higher the voltage at the gate of transistor 244, the higher the current that will flow through the transistor 244 to transistor 246. In this setup, transistor 246 acts as a current sink.

OPERATION

In operation, when identical control signals are applied to the sourcing control 226 and the sinking control 232 of the sensing circuit 222, a sourcing current and a sinking current will begin to flow to and from the charge collection element 240. If the amount of current being sourced is the same as the amount of current being sunk, then no charge will build up on the charge collection element 240 and the compensating circuit 242 will not need to do any compensating. However, if there is a difference in the sourcing and sinking currents, a charge will build up on the charge collection element 240. This charge build up will cause the voltage on the gate of transistor 244 to change, which in turn, will cause the voltage on the source terminal of transistor 244 to change (this is because compensating circuit 242 is set up as a voltage follower). As the voltage on the source terminal of transistor 244 changes, the current flow through the transistor 244 will also change. This in turn causes the current flow through transistor 246 to change. Because transistor 246 is mirrored with transistor 239, a change in current flow through transistor 246 will cause a corresponding change in current flow through transistor 239. Because transistor 239 is the current sink for sensing circuit 222, this in effect adjusts the sinking current of the sensing circuit 222. This current adjustment continues until no further charge build up occurs at the charge collection element 240, at which point the sourcing and sinking currents flowing through transistors 225 and 239, respectively, will be equalized. To take it one step further, notice that sourcing transistor 225 is mirrored with sourcing transistor 203, and that sinking transistor 239 is mirrored with sinking transistor 217. This means that the current flowing through transistors 225 and 203 will be the same and the current flowing through transistors 239 and 217 will be the same. Thus, it follows that if the sourcing current flowing through transistor 225 is the same as the sinking current flowing through transistor 239, then the sourcing current flowing through transistor 203 will be the same as the sinking current flowing through transistor 217. With the sourcing current and the sinking current being the same, a net current of substantially zero will result at the output of the charge pump 200. Hence, the present invention produces a substantially zero net current output when substantially identical input control signals are applied.

One further advantage of the present invention that should be noted is that in equalizing the sourcing and sinking currents, the present invention takes into account both direct current and transient current components. Thus, it is able to compensate for both static and dynamic current components, which means that it is effective during both switching and steady state.

SECOND PREFERRED EMBODIMENT

Figure 3:
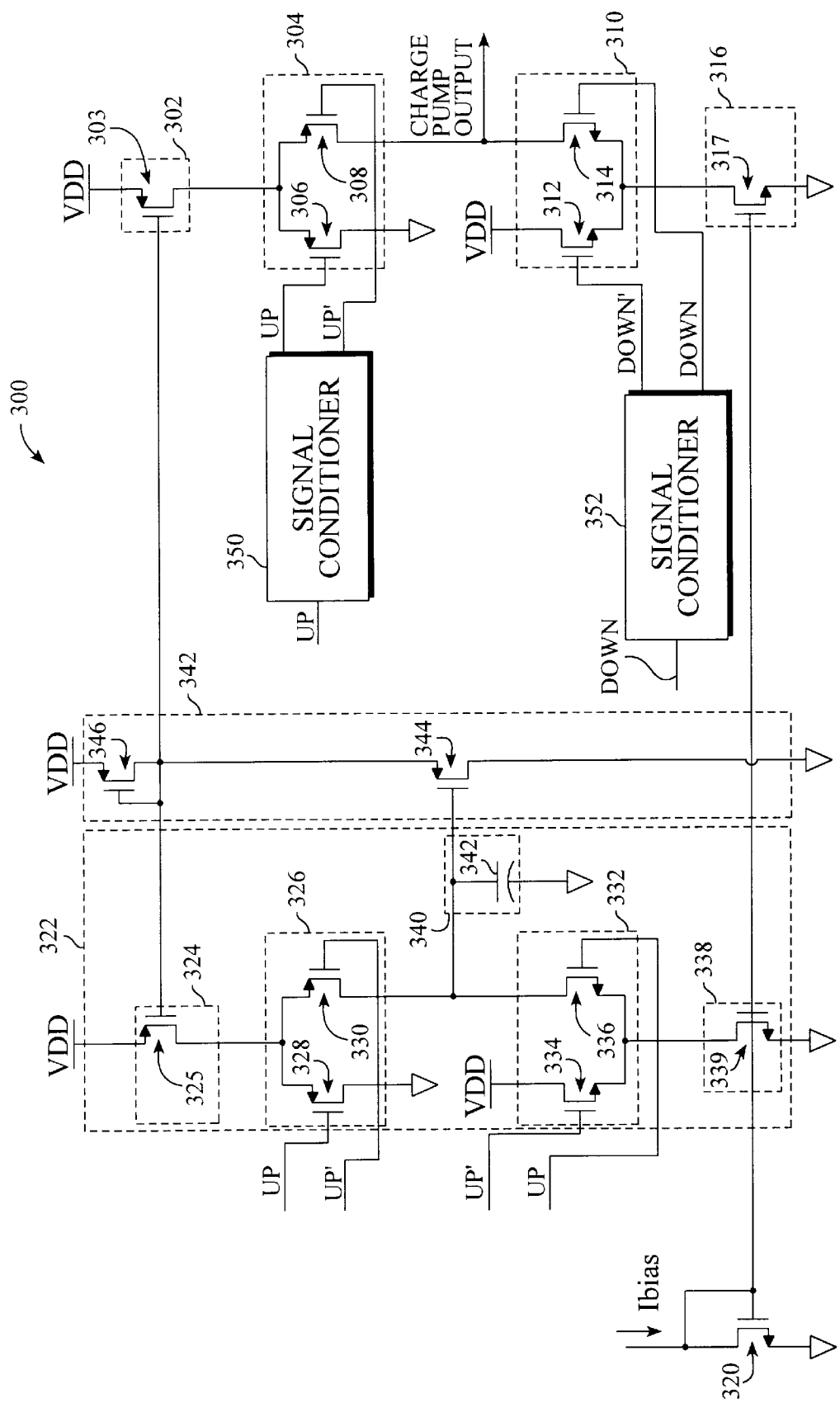
FIG. 3 is a circuit diagram of a second preferred embodiment of the present invention.

With reference to FIG. 3, there is shown a circuit diagram of a second preferred embodiment of the present invention. This embodiment is for the most part analogous to the first preferred embodiment except that instead of adjusting the sinking current to equalize it with the sourcing current, this embodiment adjusts the sourcing current to equalize it with the sinking current.

Charge pump 300 preferably first comprises a current source 302, a current sink 316, a sourcing control 304, a sinking control 310, and a biasing transistor 320. The current source 302 supplies the sourcing current to the output of the charge pump, and in the preferred embodiment, takes the form of a PMOS transistor 303 having a source terminal coupled to a voltage source VDD, a drain terminal coupled to sourcing control 304, and a gate terminal coupled to the gate terminals of transistors 325 and 346. Because the gate terminals of transistors 303, 325, and 346 are coupled together, the transistors are mirrored and thus will all conduct the same amount of current.

The amount of sourcing current that is flowed from the current source 302 to the output of the charge pump 300 is determined by the sourcing control 304. Sourcing control 304 preferably controls the sourcing current flow in response to two input control signals UP and UP'. These signals UP, UP' are preferably received from signal conditioner 350. Conditioner 350 is analogous to conditioner 250 of FIG. 2 and performs the same functions. In the preferred embodiment, sourcing control 304 takes the form of a dual transistor switch comprising a first PMOS transistor 306 having a source terminal coupled to the current source 302, a drain terminal coupled to ground, and a gate terminal coupled to receive the UP control signal, and a second PMOS transistor 308 having a source terminal coupled to the current source 302, a drain terminal coupled to the output of the charge pump 300, and a gate terminal coupled to receive the UP' control signal. By selectively directing the current flow either to ground or to the output of the charge pump in response to the control signals UP, UP', the sourcing control 304 determines the amount of sourcing current that is flowed from The current sink 316 is the element in the charge pump 300 that sinks current from the output of the charge pump. In the preferred embodiment, current sink 316 takes the form of an NMOS transistor 317 having a source terminal coupled to ground, a drain terminal coupled to sinking control 310, and a gate terminal coupled to the gate terminals of biasing transistor 320 and transistor 339. Because the gate terminals of transistors 317, 339, and 320 are coupled together, the transistors are mirrored and thus will all conduct the same amount of current.

The amount of sinking current that is flowed from the output of the charge pump 300 to the current sink 316 is determined by the sinking control 310. Sinking control 310 preferably controls the sinking current flow in response to two input control signals DOWN and DOWN'. These signals DOWN, DOWN' are preferably received from signal conditioner 352. Conditioner 352 is analogous to conditioner 252 of FIG. 2 and performs the same functions. In the preferred embodiment, sinking control 310 takes the form of a dual transistor switch comprising a first NMOS transistor 312 having a drain terminal coupled to a voltage source VDD, a source terminal coupled to the current sink 316, and a gate terminal coupled to receive the DOWN' control signal, and a second NMOS transistor 314 having a drain terminal coupled to the output of the charge pump, a source terminal coupled to the current sink 316, and a gate terminal coupled to receive the DOWN control signal. By selectively directing current flow to the current sink 316 from either the voltage source VDD or the output of the charge pump in response to the control signals DOWN, DOWN', the sinking control 310 determines the amount of sinking current that is flowed from the output of the charge pump to the current sink 316.

SENSING CIRCUIT

The charge pump 300 preferably further comprises a sensing circuit 322. In the preferred embodiment, sensing circuit 322 is substantially similar to the portion of the charge pump 300 that has been described thus far. More particularly, sensing circuit preferably comprises a current source 324, a current sink 338, a sourcing control 326, and a sinking control 332. Sensing circuit 322 preferably further comprises a charge collection element 340 which serves as the output of the sensing circuit 322.

The current source 324 provides the sourcing current for the sensing circuit 322, and in the preferred embodiment, takes the form of a PMOS transistor 325 having a source terminal coupled to a voltage source VDD, a drain terminal coupled to the sourcing control 326, and a gate terminal coupled to the gate terminals of transistors 346 and 303. Because the gate terminals of transistors 325, 346, and 303 are coupled together, they are "mirrored" and thus, will all carry the same amount of current.

The amount of sourcing current that is flowed from the current source 324 to the charge collection element 340, which serves as the output of the sensing circuit 322, is determined by the sourcing control 326. Sourcing control 326 preferably controls the sourcing current flow in response to two input control signals UP and UP'. These signals may be received from signal conditioner 350. In the preferred embodiment, sourcing control 326 takes the form of a dual transistor switch comprising a first PMOS transistor 328 having a source terminal coupled to the current source 324, a drain terminal coupled to ground, and a gate terminal coupled to receive the UP control signal, and a second PMOS transistor 330 having a source terminal coupled to the current source 324, a drain terminal coupled to the charge collection element 340, and a gate terminal coupled to receive the UP' control signal. Preferably, sourcing control 326 is constructed such that it is substantially identical to sourcing control 304. By selectively directing current flow in response to the control signals UP, UP', sourcing control 326 determines the amount of sourcing current that is flowed from the current source 324 to the charge collection element 340 of the sensing circuit 322.

The current sink 338 is the element in the sensing circuit 322 that sinks current from the charge collection element 340. In the preferred embodiment, current sink 338 takes the form of an NMOS transistor 339 having a source terminal coupled to ground, a drain terminal coupled to sinking control 332, and a gate terminal coupled to the gate terminals of biasing transistor 320 and transistor 317. Because the gate terminals of transistors 339, 317, and 320 are coupled together, they are "mirrored" and thus will all carry the same current.

The amount of sinking current that is flowed from the charge collection element 340 to the current sink 338 is determined by the sinking control 332. Sinking control 332 preferably controls the sinking current flow in response to two input control signals UP and UP'. These are the same control signals as those applied to sourcing control 326. The UP and UP' signals applied to the sinking control 332 may be received from signal conditioner 350. In the preferred embodiment, sinking control 332 takes the form of a dual transistor switch comprising a first NMOS transistor 334 having a drain terminal coupled to a voltage source VDD, a source terminal coupled to the current sink 338, and a gate terminal coupled to receive the UP' control signal, and a second NMOS transistor 336 having a drain terminal coupled to the charge collection element 340, a source terminal coupled to the current sink 338, and a gate terminal coupled to receive the UP control signal. Preferably, sinking control 332 is constructed such that it is substantially identical to sinking control 310. By selectively directing the current flow in response to the control signals UP, UP', the sinking control 332 determines the amount of sinking current that is flowed from the charge collection element 340 to the current sink 338.

Finally, sensing circuit 322 comprises a charge collection element 340, which serves as the output of the circuit. In the preferred embodiment, charge collection element 340 takes the form of a capacitor 342 having a first terminal coupled to the drain terminals of transistors 330 and 336, and a second terminal coupled to ground.

As was the case with the sensing circuit of the first preferred embodiment, one of the primary functions of the sensing circuit 322 is to provide an indication of how the elements 302, 304, 310, and 316 of the charge pump 300 will behave when substantially identical control signals are applied. More particularly, it is the purpose of the sensing circuit 322 to provide an indication of the difference in the sourcing and sinking currents produced by current source 302 and current sink 316 when substantially identical control signals are applied to the sourcing control 304 and the sinking control 310. In accordance with this purpose, sensing circuit 322 preferably: (1) receives the same control signals at both the sourcing control 326 inputs and the sinking control 332 inputs; and (2) is constructed in such a manner that the current source 324, the sourcing control 326, the sinking control 332, and the current sink 338 are substantially identical to the current source 302, the sourcing control 304, the sinking control 310, and the current sink 316, respectively. In the preferred embodiment, the UP and UP' signals are used as the input control signals for the sourcing control 326 and the sinking control 332. However, it should be noted that the DOWN and DOWN' signals may be used instead. In fact, any signals may be used so long as the same signals are applied to both the sourcing control 326 and the sinking control 332. With these criteria satisfied, the sensing circuit 322 will provide at its output a true indication of the difference in sourcing and sinking current produced by elements 302, 304, 310, and 316 when substantially identical controls signals are applied.

COMPENSATING CIRCUIT

The charge pump 300 preferably further comprises a compensating circuit 342. Once the sensing circuit 322 provides an indication of the difference in sourcing and sinking currents when substantially identical control signals are applied, it is up to the compensating circuit 342 to adjust either the sourcing current or the sinking current to equalize the two such that a substantially zero net current results at the output of the charge pump 300. In this second preferred embodiment, the compensating circuit 342 adjusts the sourcing current to equalize it with the sinking current. Compensating circuit 342 preferably comprises a first PMOS transistor 344 and a second PMOS transistor 346. Transistor 344 has a drain terminal coupled to ground, a gate terminal coupled to the charge collection element 340 of the sensing circuit 322, and a source terminal coupled to the drain terminal of transistor 346. In turn, transistor 346 has a drain terminal coupled to the source terminal of transistor 344, a source terminal coupled to a voltage source VDD, and a gate terminal coupled to the gate terminals of transistors 325 and 303, which in turn is coupled back to the source terminal of transistor 346. Because the gates of transistors 346, 325, and 303 are coupled together and are thus mirrored, they will all carry the same current. Preferably, transistor 344 is set up as a voltage follower such that the voltage at the source of the transistor 344 will be at a relatively fixed amount above the voltage at the gate. With this setup, the higher the voltage at the gate of transistor 344, the higher the current that will flow through the transistor 344 from transistor 346. In this setup, transistor 346 acts as a current source.

OPERATION

In operation, when identical control signals are applied to the sourcing control 326 and the sinking control 332 of the sensing circuit 322, a sourcing current and a sinking current will begin to flow to and from the charge collection element 340. If the amount of current being sourced is the same as the amount of current being sunk, then no charge will build up on the charge collection element 340 and the compensating circuit 342 will not need to do any compensating. However, if there is a difference in the sourcing and sinking currents, a charge will build up on the charge collection element 340. This charge build up will cause the voltage on the gate of transistor 344 to change, which in turn, will cause the voltage on the source terminal of transistor 344 to change (this is because compensating circuit 342 is set up as a voltage follower). As the voltage on the source terminal of transistor 344 changes, the current flow through the transistor 344 will also change. This in turn causes the current flow through transistor 346 to change. Because transistor 346 is mirrored with transistor 325, a change in current flow through transistor 346 will cause a corresponding change in current flow through transistor 325. Because transistor 325 is the current source for sensing circuit 322, this in effect adjusts the sourcing current of the sensing circuit 322. This current adjustment continues until no further charge build up occurs at the charge collection element 340, at which point the sourcing and sinking currents flowing through transistors 325 and 339, respectively, will be equalized. To take it one step further, notice that sourcing transistor 325 is mirrored with sourcing transistor 303 and that sinking transistor 339 is mirrored with sinking transistor 317. This means that the current flowing through transistors 325 and 303 will be the same and the current flowing through transistors 339 and 317 will be the same. Thus, it follows that if the sourcing current flowing through transistor 325 is the same as the sinking current flowing through transistor 339, then the sourcing current flowing through transistor 303 will be the same as the sinking current flowing through transistor 317. Because the sourcing current and the sinking current are the same, a net current of substantially zero will result at the output of the charge pump 300. Hence, this second preferred embodiment also produces a substantially zero net current output when substantially identical input control signals are applied.

As was the case with the first preferred embodiment, the second preferred embodiment takes into account both direct current and transient current components. Thus, it is able to compensate for both static and dynamic current components, which means that it is effective both during switching and during steady state.

At this point, it should be noted that although the invention has been described with reference to specific embodiments, it should not be construed to be so limited. Various modifications can be made by those of ordinary skill in the art with the benefit of this disclosure without departing from the spirit of the invention. Thus, the invention should not be limited by the specific embodiments used to illustrate it but only by the scope of the appended claims.

What is claimed is:

1. A charge pump, comprising:
   an output;
   a first current source;
   a first current sink;
   a first sourcing control coupled to said first current source and said output, said first sourcing control receiving at least a first current control signal, said first sourcing control controlling a sourcing current from said first current source to said output in response to said first current control signal;
   a first sinking control coupled to said first current sink and said output, said first sinking control receiving at least a second current control signal, said first sinking control controlling a sinking current from said output to said first current sink in response to said second current control signal;
   a sensing circuit having an output, said sensing circuit determining whether there is a difference between said sourcing current and said sinking current in response to first and second sense control signals being substantially identical, and providing at its output an indication of said difference; and
   a compensating circuit coupled to the output of said sensing circuit and said first current sink, said compensating circuit adjusting said sinking current in response to said indication of said difference to equalize said sinking current with said sourcing current in response to the first and second sense control signals being substantially identical.

2. The charge pump of claim 1, wherein said compensating circuit takes into account both direct current and transient current components of said sinking current and said sourcing current.

3. The charge pump of claim 1, wherein said sensing circuit comprises:
   a second current source;

a second current sink;

a charge collection element having a first terminal which serves as the output of said sensing circuit;

a second sourcing control coupled to said second current source and said first terminal, said second sourcing control receiving at least a third sense control signal, said second sourcing control controlling a second sourcing current from said second current source to said first terminal in response to said third sense control signal; and a second sinking control coupled to said second current sink and said first terminal, said second sinking control receiving at least a fourth sense control signal, said second sinking control controlling a second sinking current from said first terminal to said second current sink in response to said fourth sense control signal.

4. The charge pump of claim 3, wherein said third and fourth sense control signals are substantially identical.

5. The charge pump of claim 4, wherein said first and second current sources are mirrored to each other.

6. The charge pump of claim 5, wherein said first and second current sinks are mirrored to each other.

7. The charge pump of claim 6, wherein said first and second sourcing controls are substantially identical.

8. The charge pump of claim 7, wherein said first and second sinking controls are substantially identical.

9. The charge pump of claim 6, wherein said compensating circuit comprises:

a voltage follower having an input coupled to the output of said compensating circuit, and an output; and a third current sink coupled to the output of said voltage follower.

10. The charge pump of claim 9, wherein said third current sink is mirrored with said first and second current sinks.

11. A charge pump, comprising:

an output;

a first current source;

a first current sink;

a first sourcing control coupled to said first current source and said output, said first sourcing control receiving at least a first current control signal, said first sourcing control controlling a sourcing current from said first current source to said output in response to said first current control signal;

a first sinking control coupled to said first current sink and said output, said first sinking control receiving at least a second current control signal, said first sinking control controlling a sinking current from said output to said first current sink in response to said second current control signal;

a sensing circuit having an output, said sensing circuit determining whether there is a difference between said sourcing current and said sinking current in response to first and second sense control signals being substantially identical, and providing at its output an indication of said difference; and a compensating circuit coupled to the output of said sensing circuit and said first current source, said compensating circuit adjusting said sourcing current in response to said indication of said difference to equalize said sourcing current with said sinking current in response to the first and second sense control signals being substantially identical.

12. The charge pump of claim 11, wherein said compensating circuit takes into account both direct current and transient current components of said sinking current and said sourcing current.

13. The charge pump of claim 11, wherein said sensing circuit comprises:

a second current source;

a second current sink;

a charge collection element having a first terminal which serves as the output of said sensing circuit;

a second sourcing control coupled to said second current source and said first terminal, said second sourcing control receiving at least a third sense control signal, said second sourcing control controlling a second sourcing current from said second current source to said first terminal in response to said third sense control signal; and a second sinking control coupled to said second current sink and said first terminal, said second sinking control receiving at least a fourth sense control signal, said second sinking control controlling a second sinking current from said first terminal to said second current sink in response to said fourth sense control signal.

14. The charge pump of claim 13, wherein said third and fourth sense control signals are substantially identical.

15. The charge pump of claim 14, wherein said first and second current sources are mirrored to each other.

16. The charge pump of claim 14, wherein said first and second current sinks are mirrored to each other.

17. The charge pump of claim 14, wherein said first and second sourcing controls are substantially identical.

18. The charge pump of claim 14, wherein said first and second sinking controls are substantially identical.

19. The charge pump of claim 16, wherein said compensating circuit comprises:

a voltage follower having an input coupled to the output of said compensating circuit, and an output; and a third current source coupled to the output of said voltage follower.

20. The charge pump of claim 19, wherein said third current source is mirrored with said first and second current sources.

21. A charge pump, comprising:

an output;

a current source;

a current sink;

a sourcing control coupled to said current source and said output, said sourcing control receiving at least a first current control signal, said sourcing control controlling a sourcing current from said current source to said output in response to said first current control signal;

a sinking control coupled to said current sink and said output, said sinking control receiving at least a second current control signal, said sinking control controlling a sinking current from said output to said current sink in response to said second control current signal;

a sensing circuit having an output, said sensing circuit determining whether there is a difference between said sourcing current and said sinking current in response to first and second sense control signals being substantially identical, and providing at its output an indication of said difference; and a compensating circuit coupled to the output of said sensing circuit, said compensating circuit adjusting either said sinking current or said sourcing current in response to said indication of said difference to equalize said sinking current with said sourcing current in response to the first and second sense control signals being substantially identical.

22. The charge pump of claim 21, wherein said compensating circuit takes into account both direct current and transient current components of the sinking current and the sourcing current.

23. The charge pump of claim 1 wherein either the first or second current control signal is substantially identical to the first and second sense control signal.

24. The charge pump of claim 1, wherein said sensing circuit comprises:
   a second current source substantially identical to the first current source;
   a second current sink substantially identical to the first current sink;
   a charge collection element having a first terminal which serves as the output of said sensing circuit;
   a second sourcing control coupled to said second current source and said first terminal, said second sourcing control receiving at least a third sense control signal, said second sourcing control controlling a second sourcing current from said second current source to said first terminal in response to said third sense control signal, said second sourcing control being substantially identical to said first sourcing control; and
   a second sinking control coupled to said second current sink and said first terminal, said second sinking control receiving at least said third sense control signal, said second sinking control controlling a second sinking current from said first terminal to said second current sink in response to said third sense control signal, said second sinking control being substantially identical to the first sinking control, said third sense control signal being substantially identical to either the first or second sense control signal.

* * * * *